(12) United States Patent
Kim et al.

(10) Patent No.: US 12,745,674 B2
(45) Date of Patent: Sep. 22, 2026

(54) SEMICONDUCTOR PACKAGE HAVING A PLURALITY OF SEMICONDUCTOR CHIPS STACKED ON A SEMICONDUCTOR SUBSTRATE

(71) Applicant: Samsung Electronics Co., Ltd., Suwon-si (KR)

(72) Inventors: Younglyong Kim, Anyang-si (KR); Hyunsoo Chung, Hwaseong-si (KR); Inhyo Hwang, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 951 days.

(21) Appl. No.: 17/977,100

(22) Filed: Oct. 31, 2022

(65) Prior Publication Data

US 2023/0144602 A1 May 11, 2023

(30) Foreign Application Priority Data

Nov. 9, 2021 (KR) ........................ 10-2021-0152905

(51) Int. Cl.
*H10W 90/00* (2026.01)
*H10W 72/30* (2026.01)
(Continued)

(52) U.S. Cl.
CPC .......... *H10W 90/00* (2026.01); *H10W 74/117* (2026.01); *H10W 72/353* (2026.01);
(Continued)

(58) Field of Classification Search
CPC ... H10W 90/00; H10W 90/24; H10W 90/732; H10W 90/754; H10W 74/117;
(Continued)

(56) References Cited

U.S. PATENT DOCUMENTS 4,714,952 A 12/1987 Takekawa et al.
4,880,684 A 11/1989 Boss et al.
(Continued)

FOREIGN PATENT DOCUMENTS

JP 4858692 B2 1/2012
KR 1020020097203 A 12/2002
(Continued)

*Primary Examiner* — Khiem D Nguyen
(74) *Attorney, Agent, or Firm* — Muir Patent Law, PLLC

(57) ABSTRACT

The semiconductor package, includes: a package substrate; a substrate adhesive member on the package substrate; a plurality of semiconductor chips stacked on the substrate adhesive member and including first and second semiconductor chips; and a conductive connection member connecting the package substrate and the semiconductor chips, each of the semiconductor chips including a semiconductor chip body, a chip pad, an upper oxide layer comprised of a first material and covering an upper surface of the semiconductor chip body and exposing a portion of an upper surface of the chip pad, and a lower oxide layer comprised of a second material and covering a lower surface of the semiconductor chip body, wherein the upper oxide layer of the first semiconductor chip has an oxide bonding region between the first material and the second material in a first region in contact with the lower oxide layer of the second semiconductor chip.

20 Claims, 11 Drawing Sheets

(51) Int. Cl.
*H10W 72/50* (2026.01)
*H10W 74/10* (2026.01)
*H10W 72/00* (2026.01)
*H10W 90/24* (2026.01)

(52) U.S. Cl.
CPC ...... *H10W 72/552* (2026.01); *H10W 72/5522* (2026.01); *H10W 72/884* (2026.01); *H10W 90/24* (2026.01); *H10W 90/732* (2026.01); *H10W 90/734* (2026.01); *H10W 90/752* (2026.01); *H10W 90/754* (2026.01)

(58) Field of Classification Search
CPC . H10W 90/20; H10W 90/701; H10W 72/073; H10W 72/075; H10W 72/30; H10W 72/50; H10W 72/851; H01L 25/18; H01L 25/0657; H01L 23/562; H01L 24/48; H01L 24/50; H01L 24/83; H01L 24/85; H01L 2224/32145; H01L 2224/48145; H01L 2224/48227
See application file for complete search history.

(56) References Cited

U.S. PATENT DOCUMENTS 5,084,752 A 1/1992 Satoh et al.
5,701,233 A 12/1997 Carson et al.
5,796,165 A 8/1998 Yoshikawa et al.
5,821,627 A 10/1998 Mori et al.
6,040,621 A 3/2000 Nose
6,184,121 B1 2/2001 Buchwalter et al.
6,191,023 B1 2/2001 Chen
6,495,895 B1 12/2002 Peterson et al.
6,500,694 B1 12/2002 Enquist
6,566,232 B1 5/2003 Hara et al.
6,620,638 B1 9/2003 Farrar
6,674,159 B1 1/2004 Peterson et al.
6,784,544 B1 8/2004 Farnworth
8,232,140 B2 7/2012 Yang et al.
RE43,909 E 1/2013 Koike
8,399,974 B1 3/2013 Huneke
9,240,393 B2 1/2016 Yu et al.
9,716,080 B1 * 7/2017 Chuang .................. H01L 24/19
9,953,950 B2 4/2018 Edelstein et al.
10,332,899 B2 * 6/2019 Xu .................. H03K 19/17736
10,354,980 B1 7/2019 Mushiga et al.
10,861,812 B2 * 12/2020 Aoki ...................... H01L 24/20
11,227,858 B2 * 1/2022 Park .................. H01L 25/0657
2001/0029119 A1 10/2001 Chung
2002/0177518 A1 11/2002 Kwon et al.
2003/0038355 A1 2/2003 Derderian
2003/0043543 A1 3/2003 Farrar et al.
2003/0179800 A1 9/2003 Jebbing
2003/0222333 A1 12/2003 Bolken et al.
2004/0014257 A1 1/2004 Kim et al.
2004/0170006 A9 9/2004 Sylvester et al.
2004/0232531 A1 11/2004 Song
2005/0121804 A1 6/2005 Kuo et al.
2005/0133803 A1 6/2005 Seong et al.
2005/0173788 A1 8/2005 Cher'Khng et al.
2006/0049499 A1 3/2006 Miyaki et al.
2006/0051890 A1 3/2006 Bolken et al.
2006/0051892 A1 3/2006 Bolken et al.
2006/0097365 A1 5/2006 Song et al.
2006/0097408 A1 5/2006 Song
2006/0138951 A1 6/2006 Tain et al.
2006/0146481 A1 7/2006 Naito et al.
2006/0221556 A1 10/2006 Naito
2006/0262488 A1 11/2006 Naito et al.
2007/0018180 A1 1/2007 Lai et al.
2007/0035035 A1 2/2007 Minamio et al.
2007/0090524 A1 4/2007 Abbott
2007/0108562 A1 5/2007 Song et al.
2007/0122925 A1 5/2007 Seong et al.
2007/0152320 A1 7/2007 Yamagata
2007/0176298 A1 8/2007 Osone et al.
2007/0298545 A1 12/2007 Miyaki et al.
2008/0042227 A1 2/2008 Asano et al.
2008/0121914 A1 5/2008 Seong et al.
2009/0051036 A1 2/2009 Abbott
2009/0121321 A1 5/2009 Miccoli et al.
2009/0129040 A1 5/2009 Hsu
2009/0134507 A1 5/2009 Oh et al.
2009/0218666 A1 9/2009 Yang
2009/0246355 A9 10/2009 Lower et al.
2009/0294027 A1 12/2009 Wang
2009/0309662 A1 12/2009 Yang et al.
2010/0140781 A1 6/2010 Lee
2010/0224971 A1 9/2010 Li
2011/0006316 A1 1/2011 Ing et al.
2011/0079905 A1 4/2011 Sanchez et al.
2011/0133342 A1 6/2011 Arai
2011/0165732 A1 7/2011 Abbott
2011/0284822 A1 11/2011 Jung et al.
2012/0026337 A1 2/2012 Boulanger et al.
2012/0164539 A1 6/2012 Zhamu et al.
2012/0193790 A1 8/2012 Andry et al.
2012/0223440 A1 9/2012 Fujita
2012/0234584 A1 9/2012 Ejiri et al.
2012/0299119 A1 11/2012 Xue et al.
2013/0037947 A1 2/2013 Hayashi et al.
2013/0052489 A1 2/2013 Zhamu et al.
2013/0056776 A1 3/2013 Su et al.
2013/0214396 A1 8/2013 Kim
2013/0228913 A1 9/2013 Hayashi et al.
2014/0042298 A1 2/2014 Wan et al.
2014/0124956 A1 5/2014 Lee
2014/0175637 A1 6/2014 Stuber et al.
2014/0191334 A1 7/2014 Xue et al.
2014/0197552 A1 7/2014 Otremba et al.
2014/0267766 A1 9/2014 Boulanger et al.
2015/0041781 A1 2/2015 Hatano et al.
2015/0053976 A1 2/2015 Yamazaki et al.
2015/0130040 A1 5/2015 Defretin et al.
2015/0221586 A1 8/2015 Paek et al.
2015/0262989 A1 9/2015 Kawasaki et al.
2015/0318323 A1 11/2015 Borthakur et al.
2016/0020160 A1 1/2016 Buvid et al.
2016/0071830 A1 3/2016 Lin
2016/0190407 A1 6/2016 Ahn et al.
2016/0233347 A1 8/2016 Huang et al.
2016/0284755 A1 9/2016 Shimotsusa
2017/0154850 A1 6/2017 Kao et al.
2017/0211935 A1 7/2017 Deak et al.
2018/0130781 A1 5/2018 Kang et al.
2018/0130782 A1 * 5/2018 Lee ...................... H01L 21/561
2018/0155186 A1 6/2018 Gupta et al.
2018/0204867 A1 7/2018 Kim et al.
2019/0006399 A1 1/2019 Otake et al.
2019/0221547 A1 7/2019 Drab et al.
2019/0267414 A1 8/2019 Otake et al.
2019/0333908 A1 10/2019 Kang et al.
2020/0066682 A1 2/2020 Kim et al.
2020/0118991 A1 * 4/2020 Zhang ................ H01L 21/4832
2020/0249405 A1 8/2020 Novack et al.

FOREIGN PATENT DOCUMENTS

KR 101343343 B1 12/2013
KR 1020180052351 A 5/2018
KR 1020190099815 A 8/2019
KR 1020210019226 A 2/2021

* cited by examiner 100
110
101
120
230
220
210
200
150

100
110
101
120
230
220
210
200(200b)
200(200a)
150

SEMICONDUCTOR PACKAGE HAVING A PLURALITY OF SEMICONDUCTOR CHIPS STACKED ON A SEMICONDUCTOR SUBSTRATE

CROSS-REFERENCE TO RELATED APPLICATION

This application claims priority under 35 U.S.C. § 119 to Korean Patent Application No. 10-2021-0152905, filed on Nov. 9, 2021, with the Korean Intellectual Property Office, the entire contents of which is incorporated herein by reference.

BACKGROUND

1. Field

The present inventive concept relates to a semiconductor package.

2. Description of Related Art

As the implementation of weight reductions and high performance in electronic devices increases, miniaturization and high performance are increasing in the semiconductor package field as well. In order to realize miniaturization, weight reduction, high performance, large capacity, and high reliability of the semiconductor package, research and development of semiconductor packages having a structure in which semiconductor chips are stacked in multiple stages are continuously being conducted.

SUMMARY

An aspect of the present inventive concept is to provide a semiconductor package having improved integration and reliability.

According to an aspect of the present inventive concept, a semiconductor package, includes: a package substrate; a substrate adhesive member disposed on the package substrate; a plurality of semiconductor chips stacked on the substrate adhesive member in a vertical direction perpendicular to an upper surface of the package substrate and disposed to be shifted in a horizontal direction perpendicular to the vertical direction, the plurality of semiconductor chips including first and second semiconductor chips sequentially stacked; and a conductive connection member connecting the package substrate and the plurality of semiconductor chips, wherein each of the plurality of semiconductor chips includes a semiconductor chip body, a chip pad disposed in the semiconductor chip body, an upper oxide layer covering an upper surface of the semiconductor chip body and exposing a portion of an upper surface of the chip pad, and a lower oxide layer covering a lower surface of the semiconductor chip body, wherein the upper oxide layer comprises a first material, wherein the lower oxide layer comprises a second material, wherein the upper oxide layer of the first semiconductor chip has an oxide bonding region between the first material and the second material in a first region in contact with the lower oxide layer of the second semiconductor chip.

According to an aspect of the present inventive concept, a semiconductor package, includes: a package substrate; a substrate adhesive member disposed on the package substrate; a plurality of semiconductor chips stacked on the substrate adhesive member in a vertical direction perpendicular to an upper surface of the package substrate and disposed to be shifted in a horizontal direction perpendicular to the vertical direction the plurality of semiconductor chips being sequentially stacked; and a conductive connection member connecting the package substrate and the plurality of semiconductor chips, wherein each of the plurality of semiconductor chips includes a semiconductor chip body, a chip pad disposed in the semiconductor chip body, an upper oxide layer covering an upper surface of the semiconductor chip body and exposing a portion of an upper surface of the chip pad, and a lower oxide layer covering a lower surface of the semiconductor chip body, wherein at least a portion of the upper oxide layer of the remaining semiconductor chips except for an uppermost semiconductor chip among the plurality of semiconductor chips has an oxide bonding region, wherein a thickness of the upper oxide layer is smaller than a thickness of the substrate adhesive member.

According to an aspect of the present inventive concept, a semiconductor package, includes: a package substrate; a plurality of semiconductor chips stacked on the package substrate in a vertical direction perpendicular to an upper surface of the package substrate and disposed to be offset in a horizontal direction perpendicular to the vertical direction, the plurality of semiconductor chips including first and second semiconductor chips being sequentially stacked; and a conductive connection member connecting the package substrate and the plurality of semiconductor chips, wherein each of the plurality of semiconductor chips includes a semiconductor chip body, a chip pad disposed in the semiconductor chip body, an upper oxide layer covering an upper surface of the semiconductor chip body and exposing a portion of an upper surface of the chip pad, and a lower oxide layer covering a lower surface of the semiconductor chip body, wherein the upper oxide layer comprises a first material, wherein the lower oxide layer comprises a second material, wherein the upper oxide layer of the first semiconductor chip has an oxide bonding region between the first material and the second material in at least a portion of a first region in contact with the lower oxide layer of the second semiconductor chip, wherein the upper oxide layer does not have an oxide bonding region in a second region other than the first region, and porosity of the second material of the oxide bonding region is lower than porosity of the second material of the second region.

BRIEF DESCRIPTION OF DRAWINGS

The above and other aspects, features, and advantages of the present inventive concept will be more clearly understood from the following detailed description taken in conjunction with the accompanying drawings, in which like numerals refer to like elements throughout. In the drawings.

DETAILED DESCRIPTION

Hereinafter, example embodiments of the present inventive concept will be described with reference to the accompanying drawings as follows.

Figure 1:
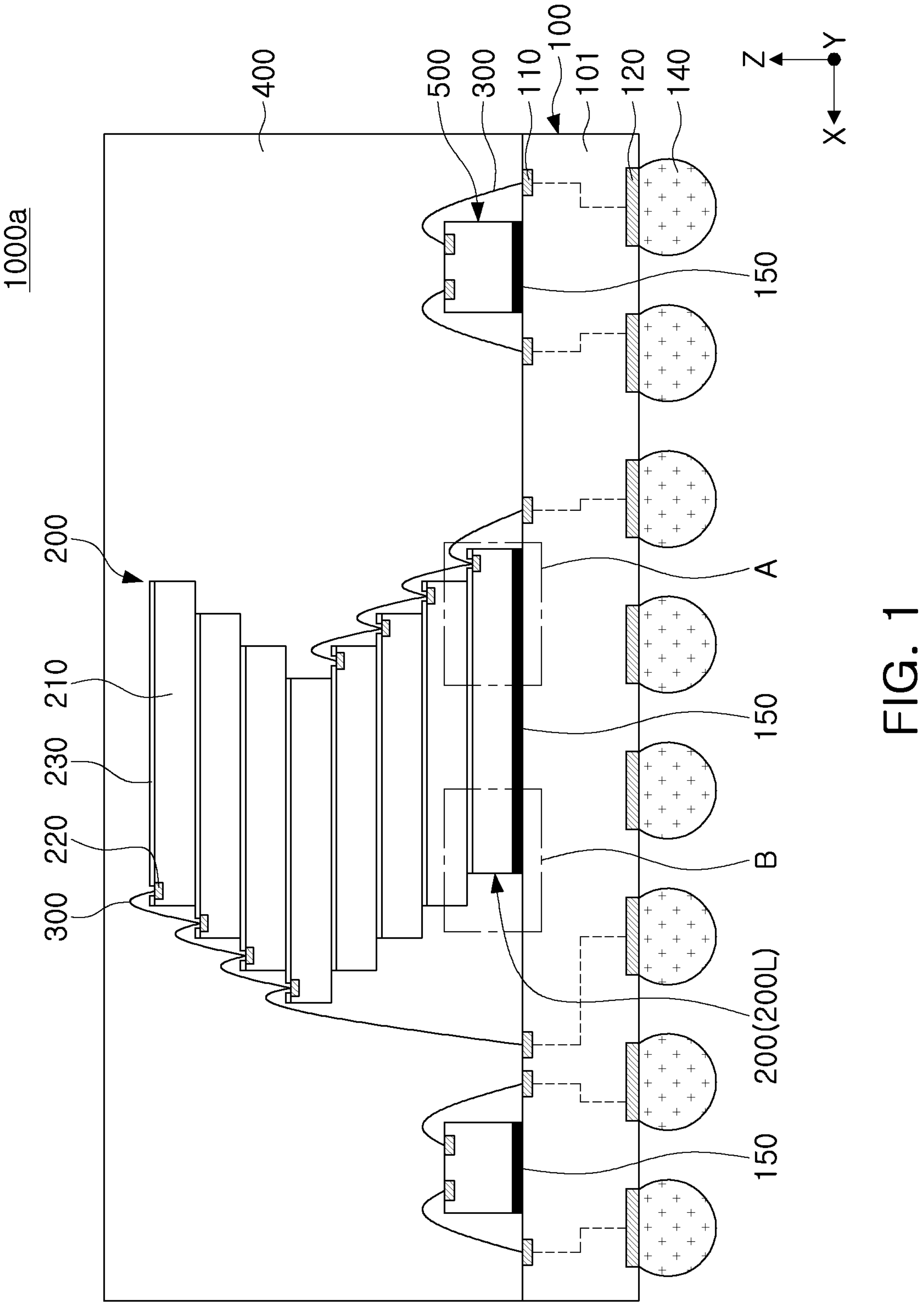
FIG. 1 is a cross-sectional view illustrating a semiconductor package, according to an example embodiment.
Figure 2A:
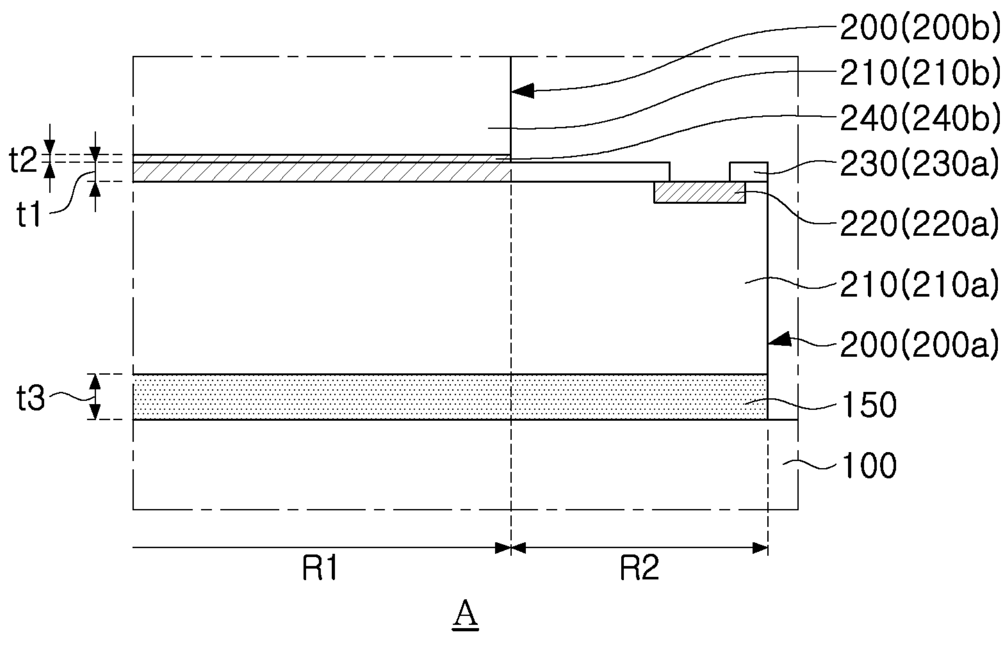
FIGS. 2A and 2B are partially enlarged views illustrating a portion of a semiconductor package, according to an example embodiment.
Figure 2B:
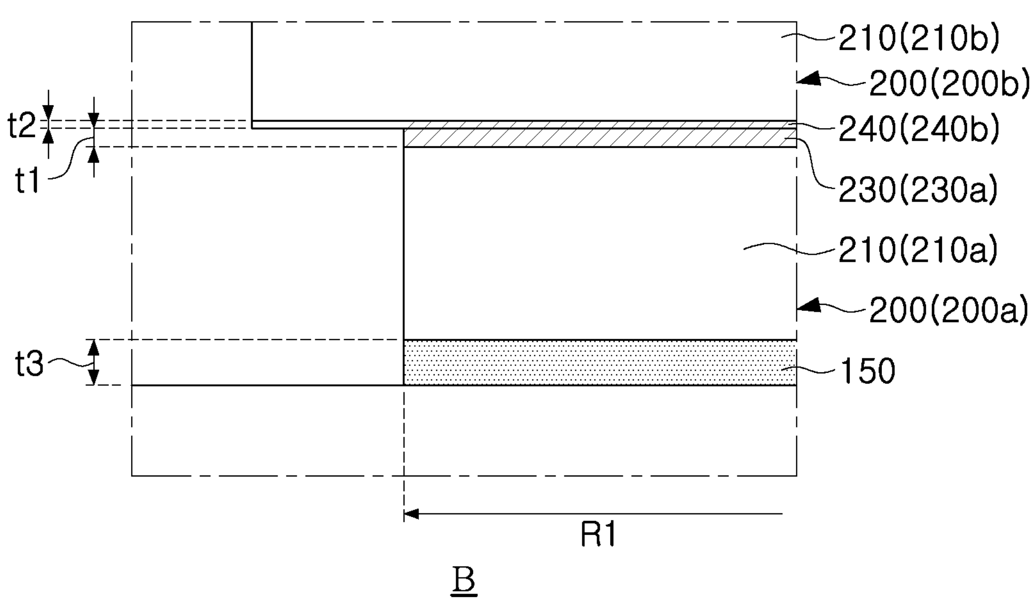

FIG. 1 is a plan view illustrating a semiconductor package 1000*a* according to an example embodiment, FIG. 2A is a partially enlarged view illustrating a region corresponding to region 'A' of FIG. 1, and FIG. 2B is a partial enlarged view illustrating a region corresponding to region 'B' of FIG. 1.

Referring to FIGS. 1 to 2B, a semiconductor package 1000*a* according to example embodiments may include a package substrate 100, a plurality of semiconductor chips 200 on the package substrate 100, and a conductive connection member 300. The semiconductor package 1000*a* may further include an encapsulant 400.

In an example embodiment, the package substrate 100 may be a printed circuit board (PCB), a glass substrate, or the like. For example, the package substrate 100 may include a rigid printed circuit board, a flexible printed circuit board, or a rigid printed circuit board. In addition, the package substrate 100 may be a double-sided printed circuit board or a multi-layer printed circuit board.

The package substrate 100 may include a core board 101, an upper connection pad 110 disposed in an upper portion of the core board 101, a lower connection pad 120 disposed in a lower portion of the core board 101, and an external terminal 140 connected to the lower connection pad 120. In embodiments, the upper connection pad 110 may include a plurality of upper connection pads 110 disposed in the upper portion of the core board 101 to be horizontally spaced apart from one another, the lower connection pad 120 may include a plurality of the lower connection pads 120 disposed in the lower portion of the core board 101 to be horizontally spaced apart from one another, and the external terminal 140 may include a plurality of external terminals 140, each of which is connected to and in contact with a corresponding one of the lower connection pads 120.

The core board 101 may include at least one interconnection layer and an insulating layer covering the interconnection layer. The interconnection layer may form an electrical path in the package substrate 100, and may include at least one metal of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C), or an alloy comprising two or more metals thereof. The upper connection pad 110 and the lower connection pad 120 may be electrically connected through the interconnection layer. The insulating layer may include a thermosetting resin such as an epoxy resin, a thermoplastic resin such as polyimide, or a resin impregnated with inorganic fillers or/and glass fibers (Glass Fiber, Glass Cloth, Glass Fabric) in these resins, for example, prepreg, Ajinomoto Build-up Film (ABF), FR-4, Bismaleimide Triazine (BT). In an example embodiment, when the package substrate 100 is a PCB substrate, the insulating layer may include a core insulating layer of a copper clad laminate.

The upper connection pads 110 may be disposed to be buried in the package substrate 100, but an example embodiment thereof is not limited thereto. The upper connection pads 110 may serve to electrically connect a plurality of semiconductor chips 200 disposed on the package substrate 100 to the package substrate 100. For example, the upper connection pads 110 may be connected to the plurality of semiconductor chips 200 disposed on the package substrate 100 through a conductive connection member 300. The lower connection pads 120 may serve to electrically connect external terminals 140 and the package substrate 100. As used herein, the term "buried" may refer to structures, patterns, and/or layers that are formed at least partially below a top surface of another structure, pattern, and/or layer. In some embodiments, when a first structure, pattern, and/or layer is "buried" in a second structure, pattern, and/or layer, the second structure, pattern, and/or layer may surround at least a portion of the first structure, pattern, and/or layer. For example, a first structure, pattern, and/or layer first may be considered to be buried when it is at least partially embedded in a second structure, pattern, and/or layer.

The external terminal 140 may electrically connect the semiconductor package 1000*a* including the package substrate 100 to another semiconductor package. The external terminal 140 may be in contact with the lower connection pad 120. In the drawings, the external terminal 140 is illustrated as a solder ball, but an example embodiment thereof is not limited thereto, and may be, for example, a solder bump, a grid array, a conductive tab, or the like. A plurality of external terminals 140 may be formed on a lower surface of the package substrate 100.

The plurality of semiconductor chips 200 may include a plurality of semiconductor chips 200 stacked on the package substrate 100. The plurality of semiconductor chips 200 may be mounted on the package substrate 100.

In an example embodiment, the at least one of the plurality of semiconductor chips 200 may be a logic chip such as a central processor (CPU), a micro processor unit (MPU), a graphics processor (GPU), or an application processor (AP), or a non-volatile memory chip such as a flash memory, a phase-change random access memory (PRAM), a magnetoresistive random access memory (MRAM), a ferroelectric random access memory (FeRAM), or a resistive random access memory (RRAM). The flash memory may be, for example, a V-NAND flash memory. In some example embodiments, at least one of the plurality of semiconductor chips 200 may be a volatile memory semiconductor chip such as a dynamic random access memory (DRAM) or a static random access memory (SRAM). In an example embodiment, at least one of the plurality of semiconductor chips 200 may be a dummy silicon spacer chip for supporting the others of the plurality of semiconductor chips 200.

In an example embodiment, all of the plurality of semiconductor chips 200 may be of the same type. For example, each of the plurality of semiconductor chips 200 may include a non-volatile memory such as a flash memory having substantially the same standard and substantially the same storage capacity. The plurality of semiconductor chips 200 may have substantially the same size. For example, each of the plurality of semiconductor chips 200 may have substantially the same horizontal width, the same horizontal length, and the same thickness.

The plurality of semiconductor chips 200 may be stacked in a vertical direction perpendicular to an upper surface of the package substrate 100, for example, in a Z-direction. Each of the plurality of semiconductor chips 200 may be disposed to be offset in a horizontal direction perpendicular to the vertical direction, for example, in an X-direction. For example, the plurality of semiconductor chips 200 may be arranged in a stair step to have a cascade structure. Accordingly, any one of the plurality of semiconductor chips 200 may be stacked having an off-set in the X-direction with respect to the semiconductor chip 200 adjacent to the one of the semiconductor chips 200. For example, the plurality of semiconductor chips 200 may be sequentially off-set-arranged. A portion of the upper surface of each of the plurality of semiconductor chips 200 may be exposed as the plurality of semiconductors chip 200 are off-set-arranged. In an example embodiment, the plurality of semiconductor chips 200 may include a silicon (Si) material.

In an example embodiment, the plurality of semiconductor chips 200 may include lower semiconductor chips stacked to be offset in an X-direction and upper semiconductor chips stacked to be offset in a direction opposite to the X-direction on the lower semiconductor chips. Each of the upper and lower semiconductor chips is illustrated as four, but the present inventive concept is not limited thereto, and the number of upper and lower semiconductor chips may be variously changed. In addition, according to example embodiments, the plurality of semiconductor chips 200 may have a cascade structure in which both the lower semiconductor chips and the upper semiconductor chips are stacked to be offset in the same direction, for example, the X-direction.

Each of the plurality of semiconductor chips 200 may include a semiconductor chip body 210, a chip pad 220 disposed in the semiconductor chip body 210, an upper oxide layer 230 covering an upper surface of the semiconductor chip body 210, and a lower oxide layer 240 covering a lower surface of the semiconductor chip body 210.

The semiconductor chip body 210 may include a semiconductor substrate. The semiconductor substrate may include, for example, silicon (Si). However, according to example embodiments, the semiconductor substrate may include a semiconductor element such as germanium (Ge), or a compound semiconductor such as silicon carbide (SiC), gallium arsenide (GaAs), indium arsenide (InAs), and indium phosphide (InP). The semiconductor substrate may have an active surface and an inactive surface opposite to the active surface. The semiconductor chip body 210 may include a semiconductor device including a plurality of discrete devices of various types formed on the active surface.

The chip pad 220 may be disposed on the active surface of the semiconductor substrate. The chip pad 220 may be disposed to be buried in the plurality of semiconductor chips 200, but an example embodiment thereof is not limited thereto. For example, an upper surface of the chip pad 220 may be at the same vertical level as an upper surface of the semiconductor chip body 210. The chip pad 220 may be electrically connected to the chip pad 220 of the adjacent semiconductor chip 200. The chip pad 220 may include a conductive layer such as metal, metal nitride, conductive carbon, or a combination thereof. The chip pad 220 may include, for example, Cu, Co, Al, Sn, Ni, Au, Ag, W, WN, Ti, TiN, Ta, TaN, Ru, Pt, or a combination thereof. The chip pad 220 may be electrically connected to active/passive devices included in each of the plurality of semiconductor chips 200.

The upper oxide layer 230 may cover a portion of an upper surface of the chip pad 220 while covering an upper surface of the semiconductor chip body 210. For example, the upper oxide layer 230 may contact a portion of the upper surface of the chip pad 220 and contact the upper surface of the semiconductor chip body 210. The upper oxide layer 230 may include a through portion exposing a portion of the upper surface of the chip pad 220. The through portion and the chip pad 220 may be disposed in an upper end portion of each of the plurality of exposed semiconductor chips 200 as the off-set alignment is performed. A first thickness t1 of the upper oxide layer 230 may be in a range of about 10 nm to about 1000 nm. The upper oxide layer 230 may be an oxide layer formed by a deposition process such as chemical vapor deposition (CVD) or a thermal oxidation process, but is not limited thereto. The upper oxide layer 230 may comprise a first material. The first material may include at least one of silicon oxide ($SiO_2$), silicon nitride (SiN), or silicon carbonitride (SiCN). The first material may be a porous material, but an example embodiment thereof is not limited thereto.

The lower oxide layer 240 may cover a lower surface of the semiconductor chip body 210. For example, an upper surface of the lower oxide layer 240 may contact the lower surface of the semiconductor chip body 210. A second thickness t2 of the lower oxide layer 240 may be thinner than the first thickness t1 of the upper oxide layer 230. For example, the second thickness t2 of the lower oxide layer 240 may be about 5 nm or less. The lower oxide layer 240 may be a native oxide formed by oxidation of the semiconductor chip body 210 at room temperature, but an example embodiment thereof is not limited thereto. The lower oxide layer 240 may comprise a second material. The second material may include silicon oxide ($SiO_2$). The second material may not be a porous material.

In an example embodiment, the plurality of semiconductor chips 200 may include a first semiconductor chip **200*a* and a second semiconductor chip 200*b* that are sequentially stacked. The second semiconductor chip 200*b* may be stacked on the first semiconductor chip 200*a* to be offset by a predetermined distance in the X-direction. Accordingly, a portion of a first upper oxide layer 230*a* of the first semiconductor chip 200*a* and a portion of the second lower oxide layer 240*b* of a second semiconductor chip 200*b* may contact each other. The first upper oxide layer 230*a* may have a first region R1 in which the first upper oxide layer 230*a* contacts the second lower oxide layer 240*b* and a second region R2 other than the first region R1. The first upper oxide layer 230*a* may have an oxide bonding region in which the first material and the second material are bonded in the first region R1. In an example embodiment, in the oxide bonding region, an interface between the first upper oxide layer 230*a* and the second lower oxide layer 240*b* may not be distinguished, but an example embodiment thereof is not limited thereto. The oxide bonding region may be formed by, for example, covalent bonding by oxygen (O). The first upper oxide layer 230*a* of the oxide bonding region may have a material different from that of the first upper oxide layer 230*a* of the second region R2. In an example embodiment, when the first material of the first upper oxide layer 230*a* is a porous material, the first material of the second region R2** has higher porosity than that of the first material in the oxide bonding region. This may be a difference generated as pores of the oxide bonding region are relatively decreased by an oxide bonding process using water vapor in the pores of the first material.

In an example embodiment, the oxide bonding region may include a region extending in a Z-direction from an upper surface of the first upper oxide layer **230*a* in contact with the second lower oxide layer 240*b* to a lower surface of the first upper oxide layer 230*a*, but an example embodiment thereof is not limited thereto, but may include a region extending from by a predetermined depth from the upper surface of the first upper oxide layer 230*a*. In some example embodiments, the first upper oxide layer 230*a* may include a lower end region where the oxide bonding process is performed only to the predetermined depth and remains unaffected by the oxide bonding process. The first upper oxide layer 230***a* may include a through portion exposing at least a portion of the upper surface of the chip pad 220 without having the oxide bonding region in the second region R2.

In an example embodiment, surface roughness of at least one of the upper surface of the upper oxide layer 230 and the lower surface of the lower oxide layer 240 may be about 3 nm or less. This may be formed by a surface treatment through a plasma process, referring to FIGS. 6B and 7A. This may be to uniformly form an oxide bonding region between the upper oxide layer 230 and the lower oxide layer 240.

In a semiconductor package 1000*a* according to an example embodiment, since the plurality of semiconductor chips 200 are connected to each other through the oxide bonding region, a separate adhesive layer such as a die attach film (DAF) may be omitted. Accordingly, an overall thickness of the semiconductor package 1000*a* may be relatively reduced, and thermal resistance between the plurality of semiconductor chips 200 in the Z-direction may be improved, thereby improving thermal characteristics. In addition, the oxide bonding region may be formed by bonding between an inorganic material and an inorganic material, and thus may have higher adhesion than bonding using an organic material.

In an example embodiment, the semiconductor package 1000*a* may further include a substrate adhesive member 150 disposed between the package substrate 100 and the plurality of semiconductor chips 200. The substrate adhesive member 150 may be in contact with a lower surface of a lowermost semiconductor chip 200L among the plurality of semiconductor chips 200. The substrate adhesive member 150 may overlap the lowermost semiconductor chip 200L in a Z-direction. A third thickness t3 of the substrate adhesive member 150 may be greater than a sum of the first thickness t1 of the upper oxide layer 230 and the second thickness t2 of the lower oxide layer 240. The third thickness t3 of the substrate adhesive member 150 may be in a range of about 3 μm to about 50 μm. The substrate adhesive member 150 may include an organic material, for example, an epoxy resin. For example, the substrate adhesive member 150 may be a die attach film (DAF). The substrate adhesive member 150 may serve to increase adhesion between the package substrate 100 and the lowermost semiconductor chip 200L. The substrate adhesive member 150 may serve to insulate between the package substrate 100 and the lowermost semiconductor chip 200L. In an example embodiment, the lowermost semiconductor chip 200L may adhere to the substrate adhesive member 150 without including the lower oxide layer 240, unlike other semiconductor chips 200, but an example embodiment thereof is not limited thereto. In some embodiments, the lowermost semiconductor chip 200L may include the lower oxide layer 240.

The conductive connection member 300 may be formed on one side of the plurality of semiconductor chips 200. The conductive connection member 300 may electrically connect the plurality of semiconductor chips 200. The conductive connection member 300 may be in contact with the chip pad 220 and/or the upper connection pad 110 to electrically connect between a plurality of semiconductor chips 200 adjacent to each other and/or a portion of the plurality of semiconductor chips 200 to the package substrate 100. The conductive connection member 300 may include a conductive material such as a metal material. For example, the conductive connection member 300 may include gold (Au), silver (Ag), or the like.

The encapsulant 400 may cover the plurality of semiconductor chips 200 and the conductive connection member 300 on the package substrate 100. In an example embodiment, the encapsulant 400 may be formed to cover side surfaces and upper portions of the plurality of semiconductor chips 200. In some embodiments, the encapsulant 400 may be formed to cover bottom surfaces of at least a portion of the plurality of semiconductor chips 200. Side surfaces of the encapsulant 400 and the package substrate 100 may be substantially exposed to the same plane. The encapsulant 400 may be formed, for example, by curing an epoxy molding compound (EMC). The encapsulant 400 may protect the plurality of semiconductor chips from external environments such as physical shock or moisture.

In an example embodiment, the semiconductor package 1000*a* may further include at least one semiconductor structure 500 disposed on a position adjacent to the plurality of semiconductor chips 200 on the package substrate 100. The semiconductor structure 500 may be of the same type as the plurality of semiconductor chips 200, but an example embodiment thereof is not limited thereto. In some embodiments, the semiconductor structure 500 may include different types of semiconductor chips or other devices. The semiconductor structure 500 may include a control unit controlling signals for the plurality of semiconductor chips 200. In an example embodiment, when the plurality of semiconductor chips 200 are memory chips, the semiconductor structure 500 may be, for example, a memory controller for controlling the memory chips. The memory controller may determine a data processing order of the memory chip and prevent errors and bad sectors. The semiconductor structure 500 may be mounted on the package substrate 100 using the substrate adhesive member 150, and may be electrically connected to the package substrate 100 through the conductive connection member 300.

Figure 3A:
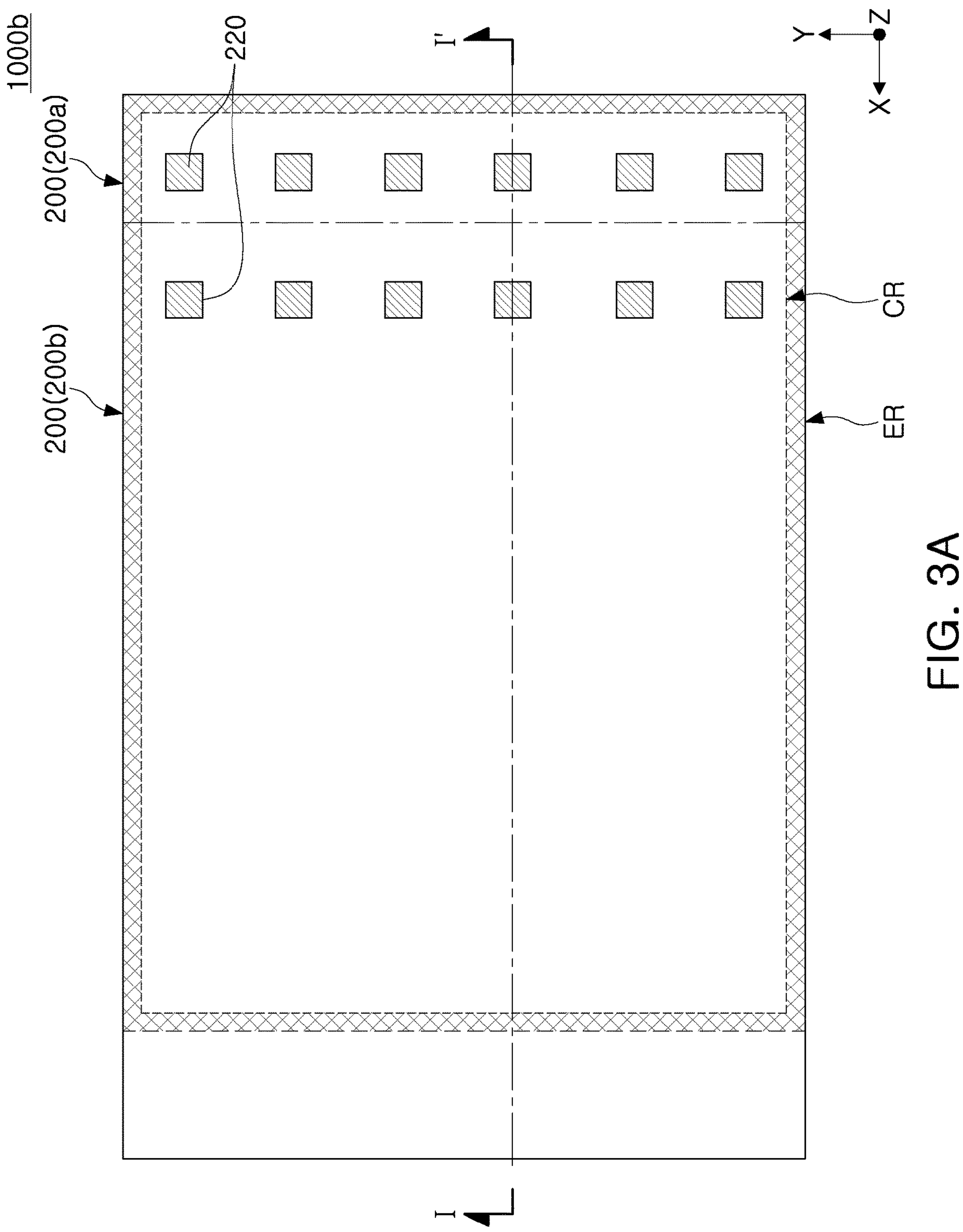
FIGS. 3A and 3B are a plan view and a cross-sectional view illustrating a portion of a semiconductor package, according to an example embodiment.
Figure 3B:
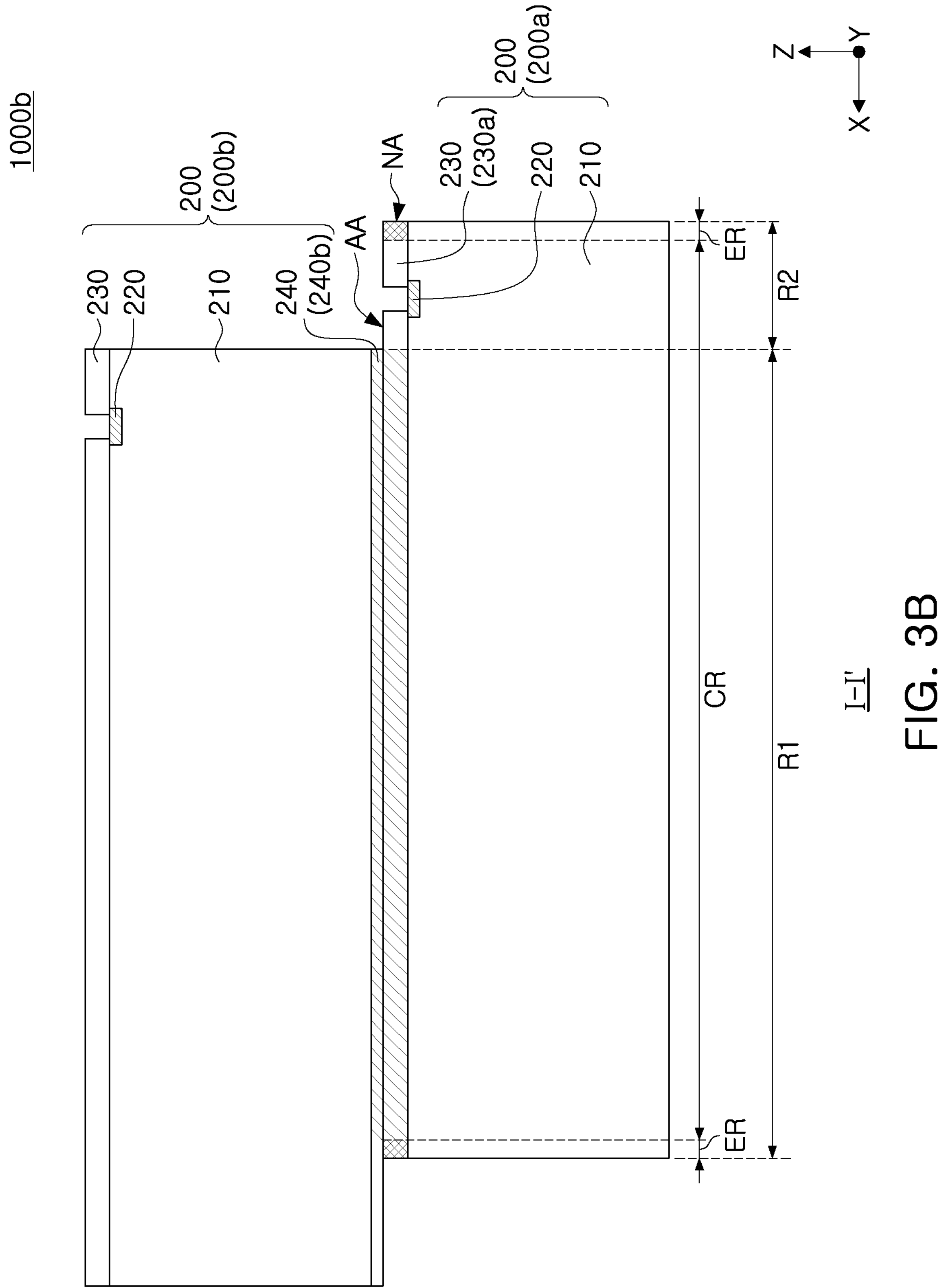

FIGS. 3A and 3B are a plan view and a cross-sectional view illustrating a part of a semiconductor package 1000*b* according to an example embodiment. FIGS. 3A and 3B are views partially illustrating only the first semiconductor chip 200*a* and the second semiconductor chip 200*b* described with reference to FIGS. 1 to 2B. FIG. 3B illustrates a cross-section taken along line I-I' of FIG. 3A. Since the semiconductor package 1000*b* according to example embodiments has the same characteristics except for a number of the plurality of semiconductor chips 200, a duplicate description thereof will be omitted.

Referring to FIGS. 3A and 3B, each of the plurality of semiconductor chips 200 may include a central region CR and an edge region ER surrounding the central region CR. The edge region ER may include a side surface of each of the plurality of semiconductor chips 200. The edge region ER may be a region in which a defect occurs due to dicing in a process of forming a semiconductor chip by dicing a wafer.

The plurality of semiconductor chips 200 may include a semiconductor chip body 210, a chip pad 220, an upper oxide layer 230, and a lower oxide layer 240, and the upper oxide layer 230 includes a first material, and the lower oxide layer 240 may include a second material.

The upper oxide layer 230 of the plurality of semiconductor chips 200 may include an active adhesive portion AA of a central region CR and a non-active adhesive portion NA of an edge region ER. In an example embodiment, unlike the active adhesive portion AA, the non-adhesive portion NA may be a region in which defects such as voids or the like occur or oxide bonding does not occur with the lower oxide layer 240 due to a change in material properties. In some example embodiments, the non-active adhesive portion NA may be a region in which oxide bonding with the lower oxide layer 240 does not occur due to a change in physical structure, such as having a thickness thinner than that of the active adhesive portion AA, including a concave portion, or the like. Referring to FIGS. 3A and 3B, for convenience of explanation, although a central region CR, an edge region ER, an active adhesive portion AA, and a non-active adhesive portion NA are illustrated with respect to the first semiconductor chip 200*a*, all of the plurality of semiconductor chips 200 including the second semiconductor chip 200*b* may include the same structure.

In an example embodiment, the second semiconductor chip 200*b* may be disposed on the first semiconductor chip 200*a* to be offset in the X-direction, and the first upper oxide layer 230*a* of the first semiconductor chip 200*a* may have a first region R1 in contact with the second lower oxide layer 240*b* and a remaining second region R2. Accordingly, the non-active adhesive portion NA may extend along three outer surfaces of the first region R1. The first upper oxide layer 230*a* of the first semiconductor chip 200*a* may have an oxide bonding region in which the first material and the second material are bonded in the active adhesive portion AA of the first region R1. The first upper oxide layer 230*a* of the first semiconductor chip 200*a* may not have the oxide bonding region in the second region R2 and the non-active adhesive portion NA.

Figure 4:
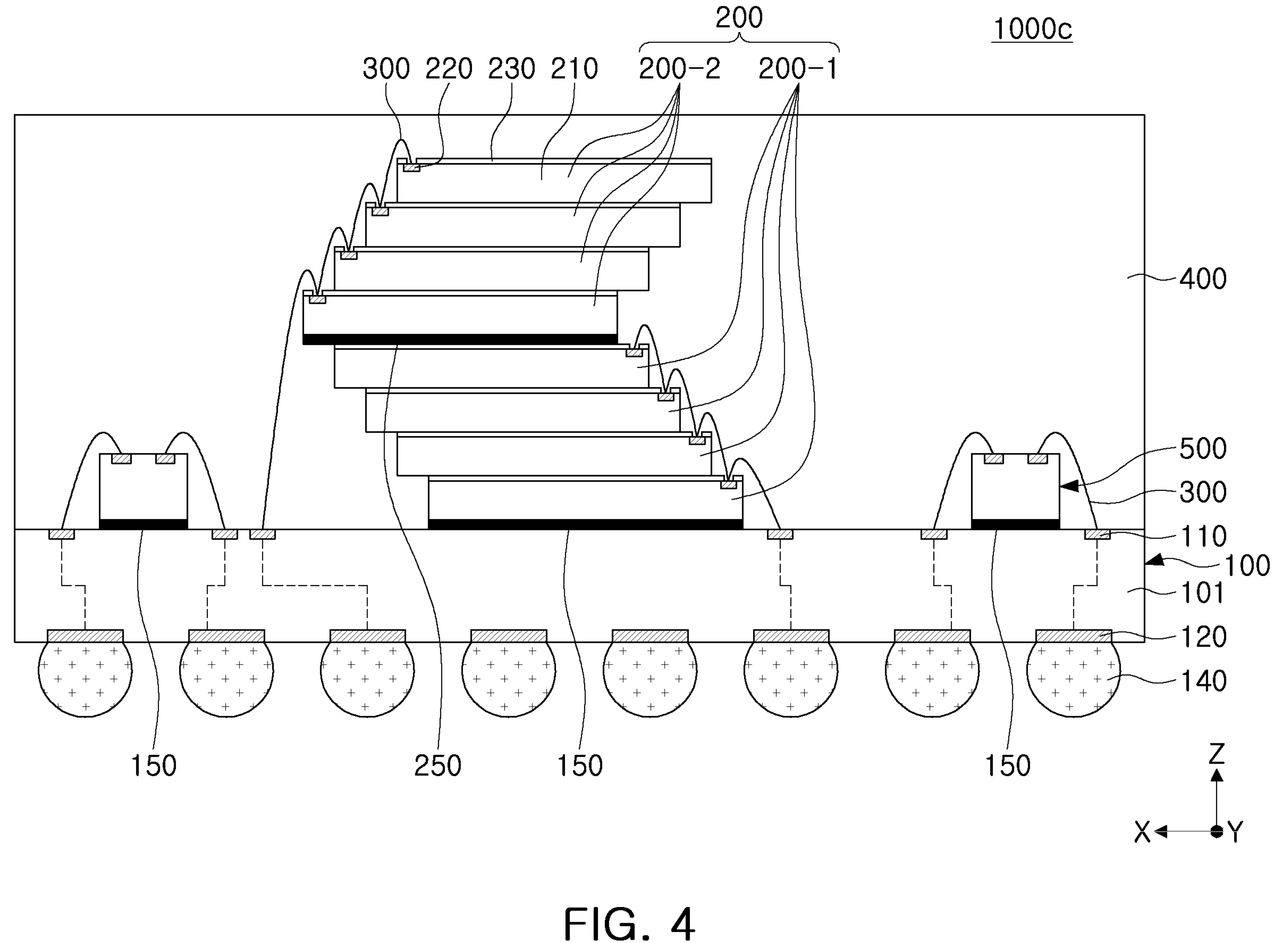
FIG. 4 is a cross-sectional view illustrating a semiconductor package, according to an example embodiment.

FIG. 4 is a cross-sectional view illustrating a semiconductor package 1000*c* according to an example embodiment.

Referring to FIG. 4, a plurality of semiconductor chips 200 may include lower semiconductor chips 200-1 stacked to be offset in an X-direction and upper semiconductor chips 200-2 stacked on the lower semiconductor chips 200-1 to be offset in a direction opposite to the X-direction.

In an example embodiment, the semiconductor package 1000*c* may further include a chip adhesive member 250. The chip adhesive member 250 may adhere the lower semiconductor chips 200-1 and the upper semiconductor chips 200-2. The chip adhesive member 250 may be, for example, a die adhesive film (DAF) attached to a lower surface of the semiconductor chip 200 disposed in a lowermost portion of the upper semiconductor chips 200-2. That is, the chip adhesive member 250 may be disposed between an uppermost semiconductor chip among the lower semiconductor chips 200-1 and a lowermost semiconductor chip among the upper semiconductor chips 200-2. Accordingly, unlike the semiconductor package 1000*a* of FIG. 1, the upper semiconductor chips 200-1 may be bonded to the lower semiconductor chips 200-2 using a chip adhesive member 250, and each of the upper semiconductor chips 200-2 and the lower semiconductor chips 200-1 may be bonded using oxide layers 230 and 240 (refer to FIG. 2A).

However, in some example embodiments, the chip adhesive member 250 may be additionally disposed not only between the upper and lower semiconductor chips 200-1 and 200-2 but also between other adjacent semiconductor chips. That is, a portion of the adjacent semiconductor chips may be bonded using the upper and lower oxide layers 230 and 240, and the remaining portions may be bonded using the chip adhesive member 250.

Figure 5:
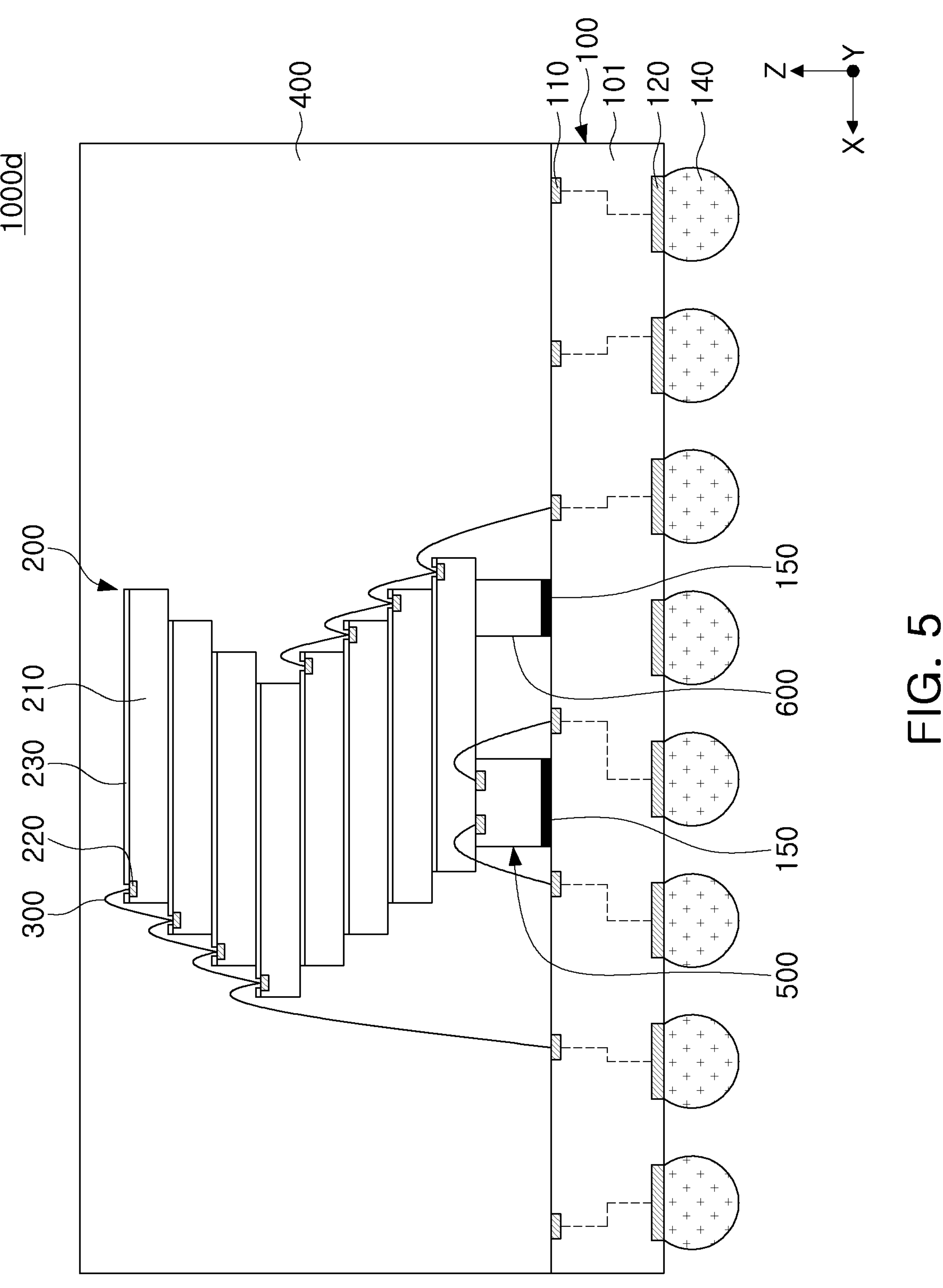
FIG. 5 is a cross-sectional view illustrating a semiconductor package, according to an example embodiment.

FIG. 5 is a cross-sectional view illustrating a semiconductor package 1000*d* according to an example embodiment.

Referring to FIG. 5, a semiconductor package 1000*d* according to example embodiments may include a semiconductor structure 500 disposed on the package substrate 100 and a plurality of semiconductor chips 200 disposed on the semiconductor structure 500.

Unlike the semiconductor package 1000*a* of FIG. 1, as the plurality of semiconductor chips 200 and the semiconductor structure 500 are not disposed side by side on the package substrate 100 and the plurality of semiconductor chips 200 are disposed on the semiconductor structure 500, a substrate adhesive member 150 disposed in a lowermost portion of the plurality of semiconductor chips 200 may be omitted. In an example embodiment, the plurality of semiconductor chips 200 and the semiconductor structure 500 may include different devices and may have different sizes. However, the sizes of the plurality of semiconductor chips 200 and the semiconductor structure 500 are not limited to the illustrated ones and may be changed in various forms.

In an example embodiment, a support member 600 disposed between the package substrate 100 and the plurality of semiconductor chips 200 may be further included. The support member 600 may be a structure for supporting the plurality of semiconductor chips 200 together with the semiconductor structure 500. The support member 600 may be a semiconductor chip, but an example embodiment thereof is not limited thereto. In example embodiments, a thickness of the support member 600 may be the same as a thickness of the semiconductor structure 500, and the substrate adhesive member 150 may be provided on the lower surface of the support member 600 to adhere the support member 600 to the package substrate 100.

Figure 6A:
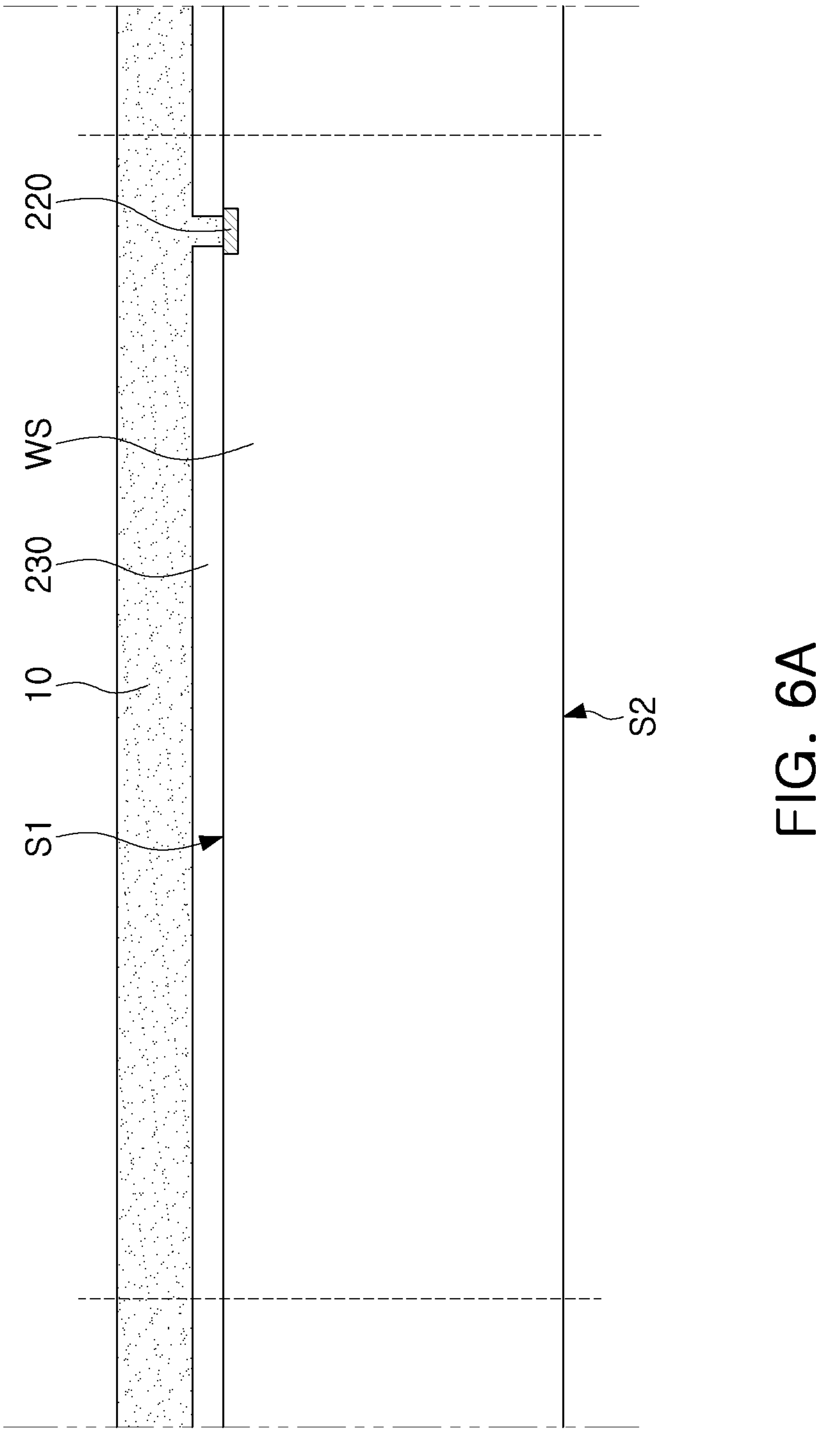
FIGS. 6A to 6C are cross-sectional views illustrating a method of manufacturing a semiconductor chip, according to example embodiments.
Figure 6B:
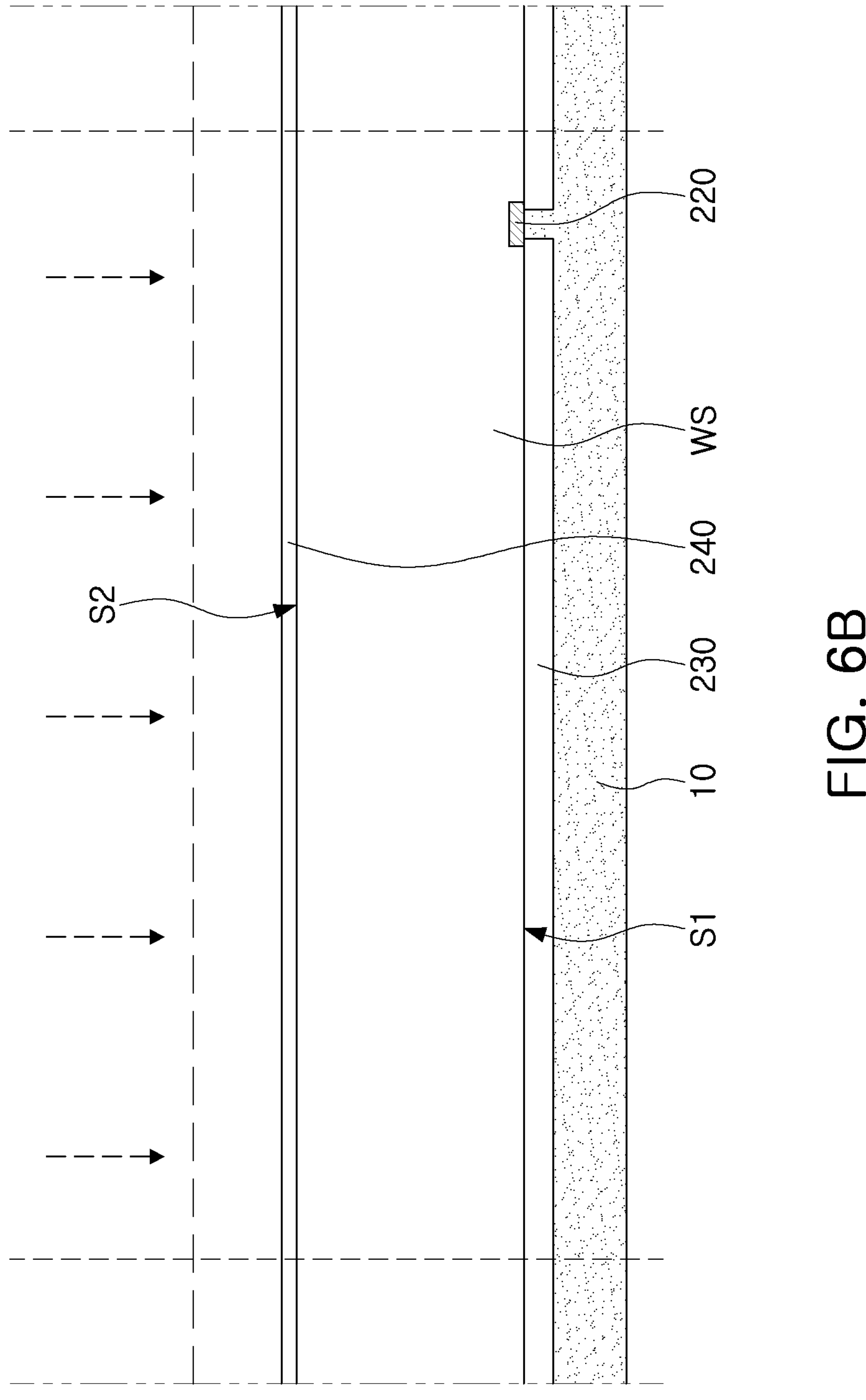
Figure 6C:
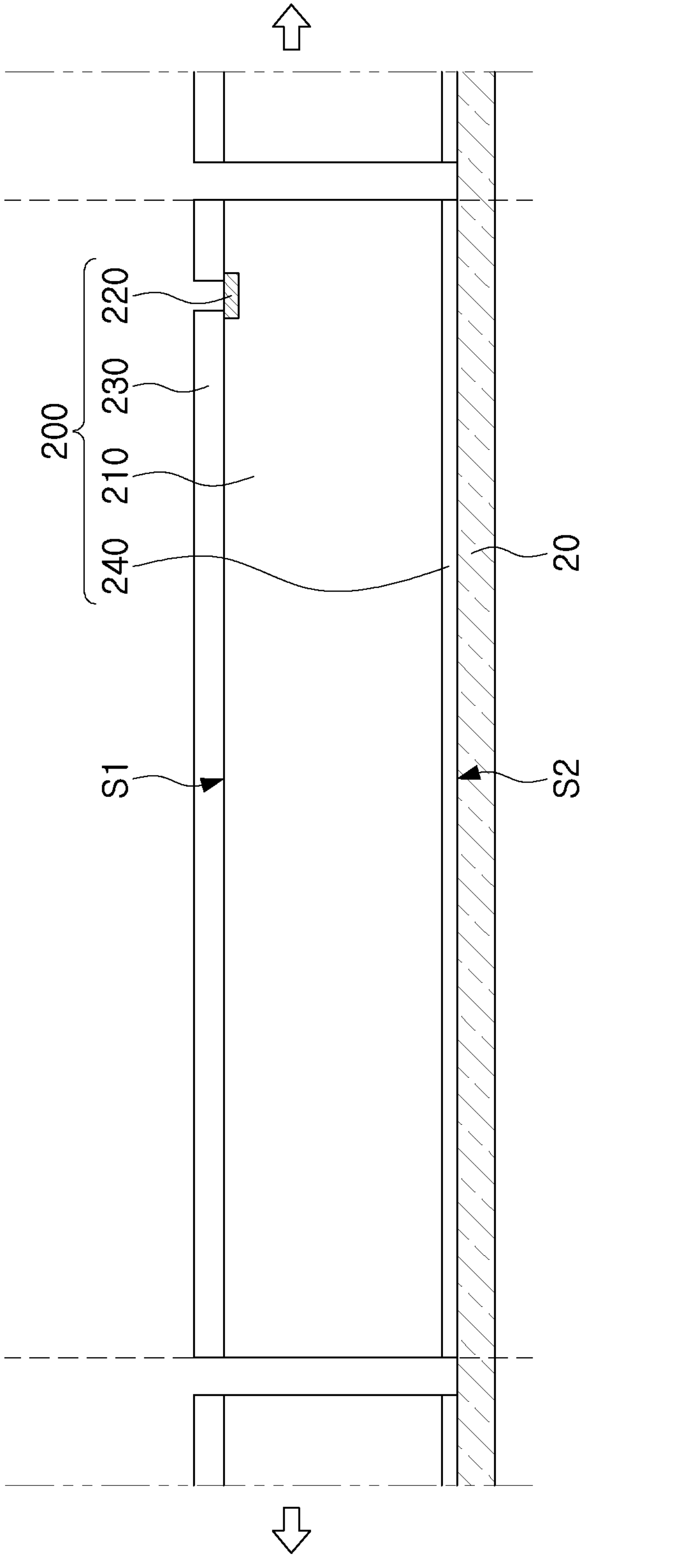

FIGS. 6A to 6C are cross-sectional views illustrating a method of manufacturing a semiconductor chip according to example embodiments.

Referring to FIG. 6A, an upper oxide layer 230 may be formed on a wafer structure WS including a circuit element and a chip pad 220, and a first tape 10 may be attached to the upper oxide layer 230.

The wafer structure WS may include a first surface S1 on which the chip pad 220 is disposed and a second surface S2 opposite to the first surface S1. A deposition process such as chemical vapor deposition (CVD) or a thermal oxidation process may be performed on the first surface S1 of the wafer structure WS to form an oxide film covering the wafer structure WS, and a polishing process such as chemical mechanical polishing (CMP), or the like, and an etching process for exposing at least a portion of an upper surface of the chip pad 220 may be performed to form an upper oxide layer 230. A thickness of the upper oxide layer 230 may be in a range from about 10 nm to about 1000 nm.

Next, a first tape 10 covering the upper oxide layer 230 and the exposed upper surface of the chip pad 220 may be formed. The first tape 10 may serve to protect the circuit element and the chip pad 220 from physical and/or chemical damage.

Referring to FIG. 6B, a wafer structure WS may be removed from a second surface S2 by a predetermined depth, and a surface treatment process may be performed on the remaining second surface S2.

The wafer structure WS may be removed by a predetermined depth from the second surface S2 by performing a grinding process. In an example embodiment, the grinding process may include a plurality of grinding processes.

When semiconductor chips are separated through a stealth dicing process in a subsequent process, in the present step, a laser may be focused inside the wafer structure WS to form a modified layer, and then the grinding process may be performed.

Next, a plasma process may be performed on the second surface S2 of the wafer structure WS remaining through the grinding process. Plasma used in the plasma process may include, for example, at least one of $N_2$, Ar, and $O_2$. A lower oxide layer 240 may be formed by making a surface of a native oxide film that may be formed on the second surface S2 of the wafer structure WS uniform through the plasma process. A thickness of the lower oxide layer 240 may be about 5 nm or less. Through the plasma process, surface roughness of the native oxide film may be controlled to be in a range of about 10 nm or less. In some embodiments, surface roughness of the native oxide film may be controlled to be in a range of about 3 nm or less. This may be to improve adhesion between semiconductor chips by uniformly forming an oxide bonding region through a subsequent process.

In some example embodiments, a deposition process such as CVD, or the like, or a thermal oxidation process may be performed on the second surface S2 of the wafer structure WS before the plasma process is performed. Accordingly, the thickness of the lower oxide layer 240 can be controlled.

Referring to FIG. 6C, a second tape 20 covering the second surface S2 of the wafer structure WS may be formed, and a semiconductor chip 200 may be formed by cutting the wafer structure WS.

The second tape 20 covering the second surface S2 of the wafer structure WS may be formed, and the first tape 10 may be removed.

Next, by applying tensile stress to the wafer structure WS by expanding the second tape 20, the wafer structure WS may be cut to form a semiconductor chip 200.

However, according to example embodiments, a method of forming the semiconductor chip 200 by cutting the wafer structure WS may be variously changed.

In an example embodiment, a surface treatment process and a cleaning process for the upper oxide layer 230 may be performed after cutting the wafer structure WS, but the process may be omitted in some example embodiments.

Figures 7A, 7B:
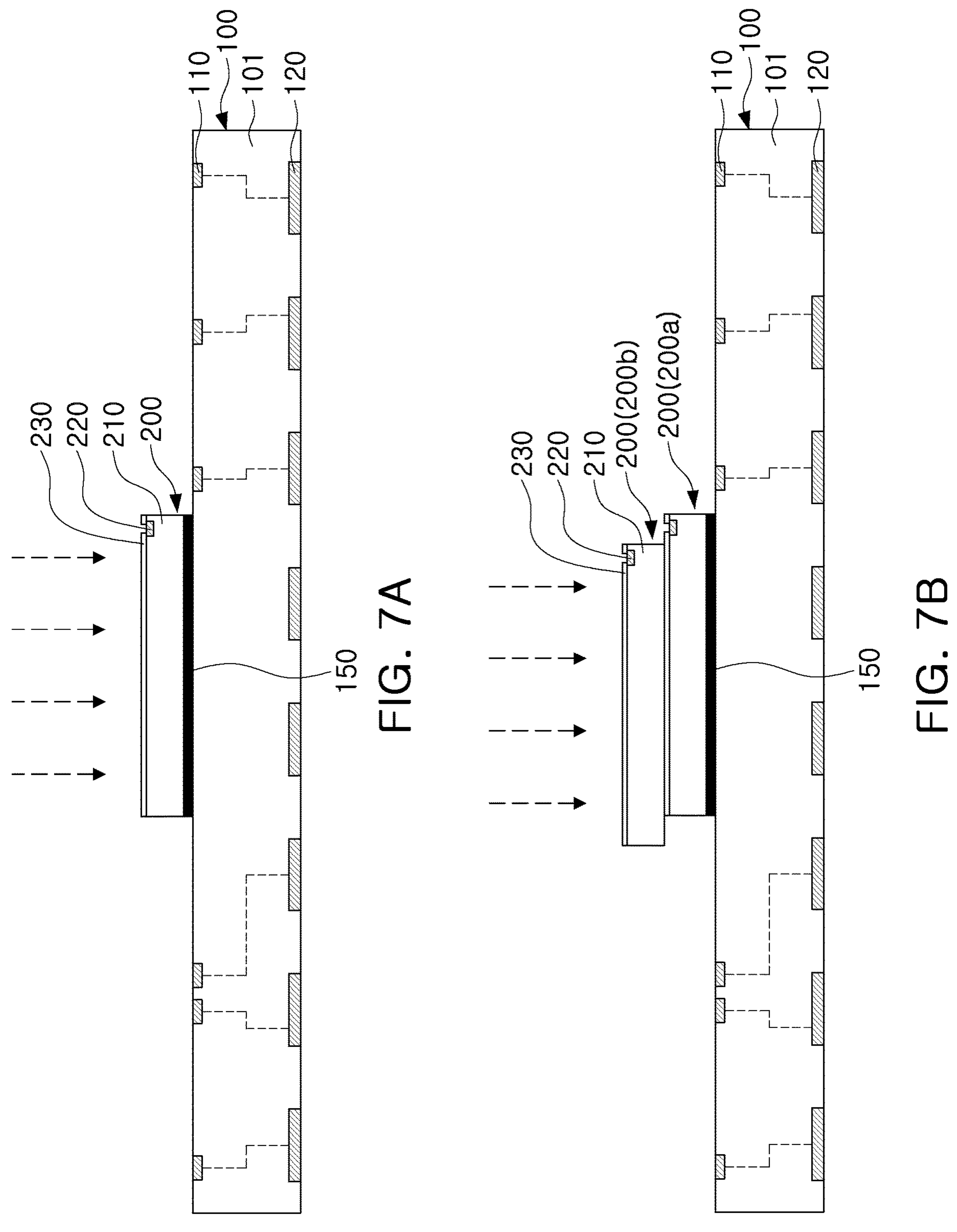
FIGS. 7A to 7C are cross-sectional views illustrating a method of manufacturing a semiconductor package, according to example embodiments.
Figure 7C:
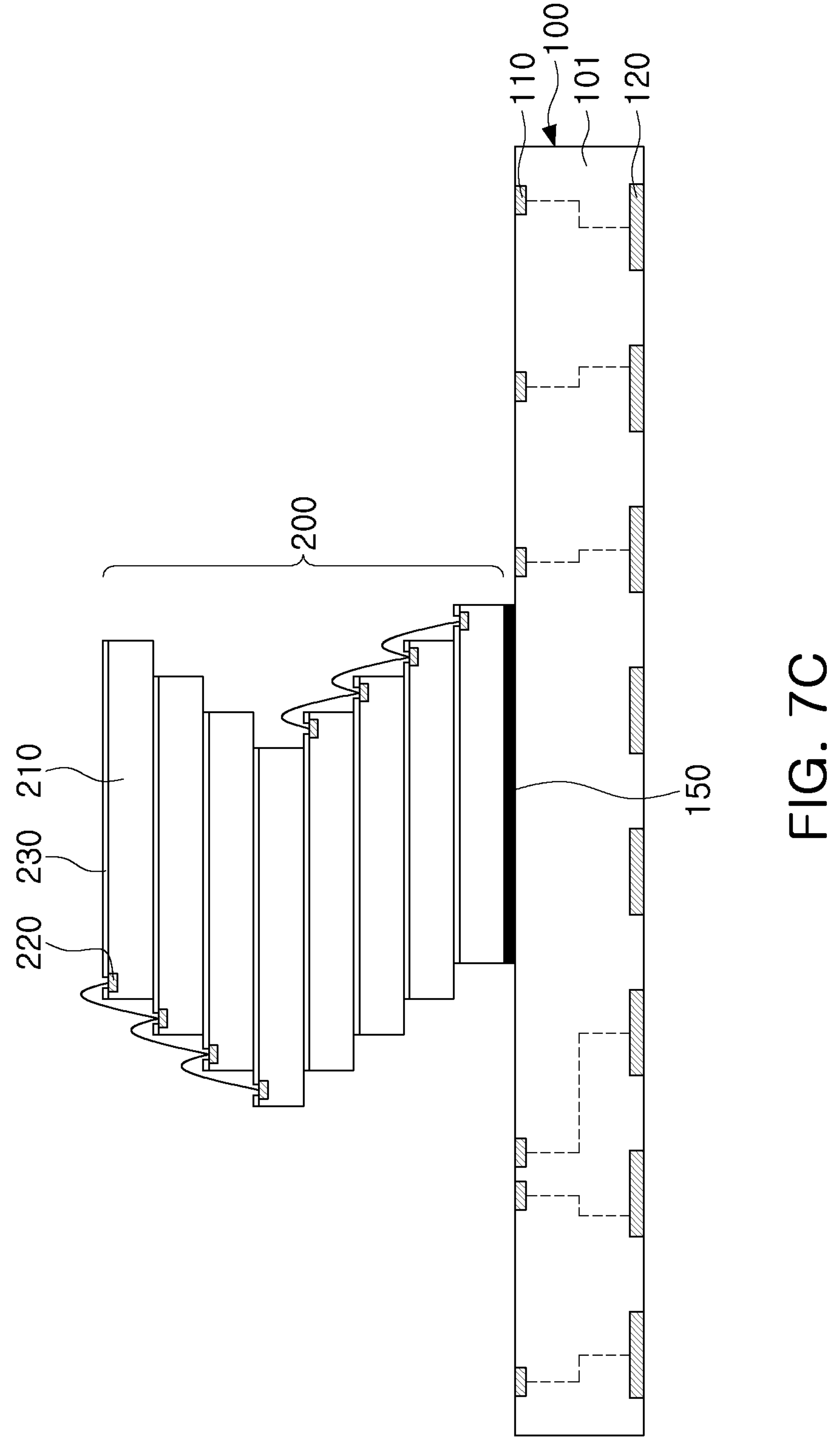

FIGS. 7A to 7C are cross-sectional views illustrating a method of manufacturing a semiconductor package according to example embodiments. FIGS. 7A to 7C are diagrams illustrating a manufacturing method for forming the semiconductor package 1000*a* of FIG. 1 using a plurality of semiconductor chips 200 formed through the manufacturing method of FIGS. 6A to 6C.

Referring to FIG. 7A, a semiconductor chip 200 may be formed on the package substrate 100, and a plasma process and a cleaning process may be performed.

A package substrate 100 including a core board 101, upper connection pads 110, and lower connection pads 120 may be formed, and a semiconductor chip 200 may be mounted on the package substrate 100 using an substrate adhesive member 150 attached to a lower surface of the semiconductor chip 200. The substrate adhesive member 150 may be, for example, a die attach film (DAF).

Next, a plasma process may be performed for surface treatment of an upper surface of the semiconductor chip 200. An upper oxide layer 230 disposed on an upper portion of the semiconductor chip 200 may be adjusted to have a surface roughness of about 10 nm or less. In some embodiments, the upper oxide layer 230 disposed on an upper portion of the semiconductor chip 200 may be adjusted to have a surface roughness in a range of about 3 nm or less, through the plasma process. This may be to improve adhesion between semiconductor chips by uniformly forming an oxide bonding region through a subsequent process.

Next, a cleaning process may be performed to remove impurities. The cleaning process may be performed using DI water or ultrasonic waves. Through the cleaning process, the upper oxide layer 230 may contain a plurality of hydroxyl groups (—OH).

Referring to FIG. 7B, a separate semiconductor chip 200 may be mounted on the semiconductor chip 200 to be offset in an X-direction, and a plasma process and a cleaning process may be performed.

In an example embodiment, the semiconductor chip 200 formed in FIG. 7A may correspond to a first semiconductor chip 200*a*, and the separate semiconductor chip 200 of FIG. 7B may correspond to a second semiconductor chip 200*b*.

After a plasma process and cleaning process of the first semiconductor chip 200*a* are performed, the second semiconductor chip 200*b* may be mounted, and the same plasma process and cleaning process as described with reference to FIG. 7A may be performed.

Referring to FIG. 7C, after stacking a plurality of semiconductor chips 200 offset by a predetermined distance in an X-direction on the package substrate 100, an annealing process may be performed.

In the same manner as described in FIGS. 7A and 7B, the plasma process and the cleaning process may be performed in a mounting step of each of the plurality of semiconductor chips 200 to form a plurality of semiconductor chips 200 having a constant surface roughness. Accordingly, an oxide bonding region between adjacent semiconductor chips 200 may be formed by stacking a plurality of semiconductor chips 200 on the package substrate 100 and then performing an annealing process. The annealing process may be performed in a range of about 100° C. to about 220° C. and a range of about 1 atm to about 10 atm. The oxide bonding region may refer to the oxide bonding region described with reference to FIGS. 1 to 2B. As the adjacent semiconductor chips 200 are bonded through the oxide bonding region, a separate adhesive layer such as the DAF may be omitted, and thus the thickness of the semiconductor package may be reduced.

However, in some example embodiments, the annealing process may not be performed after all of the plurality of semiconductor chips 200 are mounted, but may be performed each time the semiconductor chips 200 are stacked together with the plasma process and the cleaning process.

Next, conductive connection members 300 (refer to FIG. 1) connecting the package substrate 100 and the plurality of semiconductor chips 200 may be formed. The conductive connection members 300 may electrically connect the chip pads 220 of the plurality of semiconductor chips 200 to the upper connection pad 110 of the package substrate 100.

In an example embodiment, the annealing process may be performed by mounting all of the plurality of semiconductor chips 200, and the conductive connection member 300 may be formed, but an example embodiment thereof is not limited thereto. According to example embodiments, a portion of the plurality of semiconductor chips 200, for example, lower semiconductor chips, stacked to be offset in an X-direction, may be formed, the annealing process may be performed, and a lower conductive connection member 300 may be formed.

Next, an encapsulant 400 covering the plurality of semiconductor chips 200 and the conductive connection members 300 may be formed on the package substrate 100, and an external terminal 140 connected to the lower connection pad 120 of the package substrate 100 may be formed to form a semiconductor package 1000*a* of FIG. 1.

As set forth above, according to example embodiments of the present inventive concept, in a multilayer semiconductor chip stack structure, as oxide bonding regions are formed between adjacent semiconductor chips, a semiconductor package in which an adhesive member is omitted may be provided. Accordingly, a thickness of an overall package may be reduced, and thus a degree of integration of the semiconductor package may be improved.

Herein, a lower side, a lower portion, a lower surface, and the like, are used to refer to a direction toward a mounting surface of the fan-out semiconductor package in relation to cross-sections of the drawings, while an upper side, an upper portion, an upper surface, and the like, are used to refer to an opposite direction to the direction. However, these directions are defined for convenience of explanation, and the claims are not particularly limited by the directions defined as described above. The term "thickness," as used herein, refers to the thickness or height measured in a direction perpendicular to a top surface of the package substrate 100.

The meaning of a "connection" of a component to another component in the description includes an indirect connection through an adhesive layer as well as a direct connection between two components. In addition, "electrically connected" conceptually includes a physical connection and a physical disconnection. As used herein, the term "contact" refers to direct contact (i.e., touching) unless the context indicates otherwise.

It can be understood that when an element is referred to with terms such as "first" and "second," the element is not limited thereby. Such terms may be used only for a purpose of distinguishing the element from other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

While example embodiments have been shown and described above, it will be apparent to those skilled in the art that modifications and variations could be made without departing from the scope of the present inventive concept as defined by the appended claims.

What is claimed is:

1. A semiconductor package, comprising:

a package substrate;

a substrate adhesive member disposed on the package substrate;

a plurality of semiconductor chips stacked on the substrate adhesive member in a vertical direction perpendicular to an upper surface of the package substrate and disposed to be offset in a horizontal direction perpendicular to the vertical direction, the plurality of semiconductor chips including first and second semiconductor chips sequentially stacked; and a conductive connection member connecting the package substrate and the plurality of semiconductor chips, wherein each of the plurality of semiconductor chips includes a semiconductor chip body, a chip pad disposed in the semiconductor chip body, an upper oxide layer covering an upper surface of the semiconductor chip body and exposing a portion of an upper surface of the chip pad, and a lower oxide layer covering a lower surface of the semiconductor chip body, wherein the upper oxide layer comprises a first material, wherein the lower oxide layer comprises a second material, and wherein the upper oxide layer of the first semiconductor chip has an oxide bonding region between the first material and the second material in a first region in contact with the lower oxide layer of the second semiconductor chip.

2. The semiconductor package of claim 1, wherein the first material comprises at least one of silicon oxide, silicon nitride, or silicon carbonitride, and wherein the second material comprises silicon oxide.

3. The semiconductor package of claim 1, wherein a thickness of the upper oxide layer is greater than a thickness of the lower oxide layer.

4. The semiconductor package of claim 1, wherein a thickness of the upper oxide layer is in a range from about 10 nm to about 1000 nm, and wherein a thickness of the lower oxide layer is in a range of about 5 nm or less.

5. The semiconductor package of claim 1, wherein surface roughness of at least one of an upper surface of the upper oxide layer and a lower surface of the lower oxide layer is about 3 nm or less.

6. The semiconductor package of claim 1, wherein the substrate adhesive member overlaps a lowermost semiconductor chip among the plurality of semiconductor chips in the vertical direction, and wherein a thickness of the substrate adhesive member is greater than a sum of a thickness of the upper oxide layer and a thickness of the lower oxide layer.

7. The semiconductor package of claim 1, wherein the substrate adhesive member comprises a die attach film, and wherein a thickness of the substrate adhesive member is in a range of about 3 μm to about 50 μm.

8. The semiconductor package of claim 1, wherein the upper oxide layer of the first semiconductor chip comprises a second region other than the first region, and wherein the second region includes a through portion exposing at least a portion of the upper surface of the chip pad.

9. The semiconductor package of claim 8, wherein the second region of the upper oxide layer comprises a material different from a material of the oxide bonding region of the upper oxide layer.

10. The semiconductor package of claim 1, wherein each of the plurality of semiconductor chips has a central region and an edge region surrounding the central region and including a side surface of each of the plurality of semiconductor chips, and wherein the upper oxide layer includes an active adhesive portion of the central region and a non-active adhesive portion of the edge region.

11. The semiconductor package of claim 10, wherein the oxide bonding region is disposed in a portion of the active adhesive portion and is not disposed in the non-active adhesive portion.

12. The semiconductor package of claim 1, further comprising:

an encapsulant covering the plurality of semiconductor chips and the conductive connection member on the package substrate.

13. The semiconductor package of claim 1, wherein the plurality of semiconductor chips comprise lower semiconductor chips stacked to be offset in a first horizontal direction perpendicular to the vertical direction, and upper semiconductor chips stacked to be offset in a second horizontal direction opposite to the first horizontal direction on the lower semiconductor chips.

14. A semiconductor package, comprising:

a package substrate;

a substrate adhesive member disposed on the package substrate;

a plurality of semiconductor chips stacked on the substrate adhesive member in a vertical direction perpendicular to an upper surface of the package substrate and disposed to be offset in a horizontal direction perpendicular to the vertical direction, the plurality of semiconductor chips being sequentially stacked; and a conductive connection member connecting the package substrate and the plurality of semiconductor chips, wherein each of the plurality of semiconductor chips includes a semiconductor chip body, a chip pad disposed in the semiconductor chip body, an upper oxide layer covering an upper surface of the semiconductor chip body and exposing a portion of an upper surface of the chip pad, and a lower oxide layer covering a lower surface of the semiconductor chip body, wherein at least a portion of the upper oxide layer of semiconductor chips except for an uppermost semiconductor chip among the plurality of semiconductor chips has an oxide bonding region, and wherein a thickness of the upper oxide layer is smaller than a thickness of the substrate adhesive member.

15. The semiconductor package of claim 14, wherein the plurality of semiconductor chips comprise a first semiconductor chip and a second semiconductor chip sequentially stacked, wherein the upper oxide layer of the first semiconductor chip comprises a first region bonded to the second semiconductor chip and a second region other than the first region, and wherein a material of the first region is different from a material of the second region.

16. The semiconductor package of claim 15, wherein the material of the second region comprises a porous material having higher porosity than the material of the first region.

17. The semiconductor package of claim 15, wherein the second region comprises at least a portion of a region surrounding a side portion of the upper oxide layer.

18. The semiconductor package of claim 14, wherein the plurality of semiconductor chips comprise a lowermost first semiconductor chip and second semiconductor chips other than the first semiconductor chip, wherein a lower surface of the first semiconductor chip is in contact with the substrate adhesive member, and wherein lower surfaces of the second semiconductor chips are in contact with the upper oxide layer.

19. A semiconductor package, comprising:

a package substrate;

a plurality of semiconductor chips stacked on the package substrate in a vertical direction perpendicular to an upper surface of the package substrate and disposed to be offset in a horizontal direction perpendicular to the vertical direction, the plurality of semiconductor chips including first and second semiconductor chips being sequentially stacked; and a conductive connection member connecting the package substrate and the plurality of semiconductor chips, wherein each of the plurality of semiconductor chips includes a semiconductor chip body, a chip pad disposed in the semiconductor chip body, an upper oxide layer covering an upper surface of the semiconductor chip body and exposing a portion of an upper surface of the chip pad, and a lower oxide layer covering a lower surface of the semiconductor chip body, wherein the upper oxide layer comprises a first material, wherein the lower oxide layer comprises a second material, wherein the upper oxide layer of the first semiconductor chip has an oxide bonding region between the first material and the second material in at least a portion of a first region in contact with the lower oxide layer of the second semiconductor chip, wherein the upper oxide layer does not have an oxide bonding region in a second region other than the first region, and wherein porosity of the first material of the oxide bonding region is lower than porosity of the first material of the second region.

20. The semiconductor package of claim 19, wherein a peripheral portion of the first region does not have the oxide bonding region.

* * * * *